(12) United States Patent
Ghosh et al.

(10) Patent No.: US 8,563,436 B2
(45) Date of Patent: Oct. 22, 2013

(54) CHEMICAL MECHANICAL POLISHING COMPOSITION AND METHODS RELATING THERETO

(71) Applicant: Rohm and Haas Electronic Materials CMP Holdings, Inc., Newark, DE (US)

(72) Inventors: Tirthankar Ghosh, Oreland, PA (US); Terence M. Thomas, Newark, DE (US); Hongyu Wang, Wilmington, DE (US); Scott A. Ibbitson, Trappe, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 13/854,267

(22) Filed: Apr. 1, 2013

(65) Prior Publication Data

US 2013/0217230 A1 Aug. 22, 2013

Related U.S. Application Data

(62) Division of application No. 12/185,600, filed on Aug. 4, 2008.

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |

(52) U.S. Cl.
USPC ............ 438/692; 438/689; 438/691; 216/52; 216/53; 216/83; 216/88; 216/89

(58) Field of Classification Search
None
See application file for complete search history.

(56) References Cited

U.S. PATENT DOCUMENTS

| | | | | |
|---|---|---|---|---|
| 6,443,812 | B1 * | 9/2002 | Costas et al. | 451/41 |
| 6,615,717 | B1 * | 9/2003 | Perdu | 101/223 |
| 6,632,259 | B2 * | 10/2003 | Weinstein et al. | 51/298 |
| 6,679,928 | B2 * | 1/2004 | Costas et al. | 51/307 |
| 7,086,935 | B2 * | 8/2006 | Wang | 451/41 |
| 7,303,993 | B2 * | 12/2007 | Kelley et al. | 438/692 |
| 2006/0110924 | A1 * | 5/2006 | Ghosh et al. | 438/692 |
| 2007/0082456 | A1 * | 4/2007 | Uotani et al. | 438/427 |
| 2007/0128872 | A1 * | 6/2007 | Itoh et al. | 438/691 |
| 2008/0115422 | A1 * | 5/2008 | Suzuki et al. | 51/298 |

FOREIGN PATENT DOCUMENTS

WO WO 2004101221 * 11/2004

* cited by examiner

*Primary Examiner* — Nadine G Norton
*Assistant Examiner* — Stephanie Duclair
(74) *Attorney, Agent, or Firm* — Thomas S. Deibert

(57) ABSTRACT

A method for chemical mechanical polishing of a semiconductor wafer containing a nonferrous metal is provided, comprising: providing a chemical mechanical polishing composition comprising 1 to 25 wt % of an oxidizer; 0.01 to 15 wt % of an inhibitor for the nonferrous metal; 0.005 to 5 wt % of a copolymer of poly(ethylene glycol) methyl ether(meth)acrylate and 1-vinylimidazole; and water; wherein the chemical mechanical polishing composition has an acidic pH; providing a chemical mechanical polishing pad; providing a semiconductor wafer containing the nonferrous metal; creating dynamic contact between the chemical mechanical polishing pad and the semiconductor wafer; and, dispensing the polishing solution at or near the interface between the chemical mechanical polishing pad and the semiconductor wafer.

7 Claims, No Drawings

CHEMICAL MECHANICAL POLISHING COMPOSITION AND METHODS RELATING THERETO

This application is a divisional of U.S. patent application Ser. No. 12/185,600 filed Aug. 4, 2008.

The invention relates to chemical mechanical polishing of semiconductor wafer materials. More particularly, the invention relates to a chemical mechanical polishing composition and methods for polishing metal interconnects on semiconductor wafers in the presence of dielectrics and barrier materials using the chemical mechanical polishing composition.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

Chemical mechanical polishing processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration.

U.S. Pat. No. 7,086,935 (Wang) describes the use of an abrasive-free copper formulation containing methyl cellulose, an acrylic acid/methacrylic acid copolymer, benzotriazole (BTA) and miscible solvent for patterned wafers. The formulation taught and described by Wang is capable of removing and clearing copper with low copper dishing, but during rapid polishing, the formulation precipitates a green Cu-BTA compound on the polishing pad and wafer. These precipitates require a post-polishing cleaning of the polishing pad to avoid a decrease in polishing removal rate associated with the gum-like precipitate; and they require a post-polishing cleaning of the wafer to avoid defect creation. Such additional cleaning steps require strong and costly cleaning compounds and have an associated "cost of ownership" arising from the delayed wafer throughput.

Hence, there remains a need for chemical mechanical polishing compositions capable of high removal rates with low dishing and that leave a surface clear of interconnect metal residue after a short second step polishing time.

In one aspect of the present invention, there is provided a chemical mechanical polishing composition useful for chemical mechanical polishing of a patterned semiconductor wafer containing a copper interconnect metal, comprising: 0.01 to 15 wt % of an inhibitor for the copper interconnect metal; 0.005 to 5 wt % of a copolymer of poly(ethylene glycol) methyl ether(meth)acrylate and 1-vinylimidazole; and water; wherein the chemical mechanical polishing composition has an acidic pH.

In another aspect of the present invention, there is provided a chemical mechanical polishing composition useful for chemical mechanical polishing of a patterned semiconductor wafer containing a copper interconnect metal, comprising: 0.01 to 15 wt % of an inhibitor for the copper interconnect metal; 0.005 to 5 wt % of a copolymer of poly(ethylene glycol) methyl ether(meth)acrylate and 1-vinylimidazole; 0.05 to 20 wt % of a water soluble acid compound of formula I as follows:

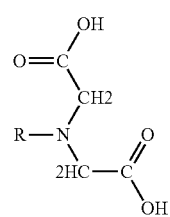

wherein R is a hydrogen or a carbon-containing compound; 0.01 to 15 wt % of a complexing agent for the copper interconnect metal; 0.01 to 15 wt % of a phosphorus compound; 0 to 25 wt % of an oxidizer; and water; wherein the chemical mechanical polishing composition has an acidic pH.

In another aspect of the present invention, there is provided a chemical mechanical polishing composition useful for chemical mechanical polishing of a patterned semiconductor wafer containing a copper interconnect metal, comprising: an inhibitor for the copper interconnect metal; 0.001 to 15 wt % of a water soluble cellulose; 0.05 to 20 wt % of a water soluble acid compound of formula I as follows:

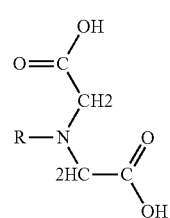

wherein R is a hydrogen or a carbon-containing compound; 0.005 to 5 wt % of a copolymer of poly(ethylene glycol) methyl ether(meth)acrylate and 1-vinylimidazole; 0.01 to 15 wt % of a complexing agent for the copper interconnect metal; 0.01 to 15 wt % of a phosphorus compound; 0 to 25 wt % of an oxidizer; and water; and wherein the chemical mechanical polishing composition has an acidic pH.

In another aspect of the present invention, there is provided, a chemical mechanical polishing composition useful for chemical mechanical polishing of a patterned semiconductor wafer containing a nonferrous metal, comprising: 0.01 to 15 wt % of an inhibitor for the nonferrous metal; 0.005 to 5 wt % of a copolymer of poly(ethylene glycol) methyl ether (meth)acrylate and 1-vinylimidazole; and water; wherein the chemical mechanical polishing composition has an acidic pH.

In another aspect of the present invention, there is provided a chemical mechanical polishing composition useful for chemical mechanical polishing of a patterned semiconductor wafer containing a nonferrous metal, comprising: an inhibitor for the nonferrous metal; 0.001 to 15 wt % of a water soluble cellulose; 0.05 to 20 wt % of a water soluble acid compound of formula I as follows:

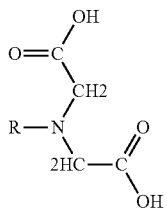

wherein R is a hydrogen or a carbon-containing compound; 0.005 to 5 wt % of a copolymer of poly(ethylene glycol) methyl ether(meth)acrylate and 1-vinylimidazole; 0.01 to 15 wt % of a complexing agent for the nonferrous metal; 0.01 to 15 wt % of a phosphorus compound; 0 to 25 wt % of an oxidizer; and water; wherein the chemical mechanical polishing composition has an acidic pH.

In another aspect of the present invention, there is provided a method for chemical mechanical polishing of a semiconductor wafer containing a nonferrous metal, comprising: (a) providing a chemical mechanical polishing composition comprising 1 to 25 wt % of an oxidizer; 0.01 to 15 wt % of an inhibitor for the nonferrous metal; 0.005 to 5 wt % of a copolymer of poly(ethylene glycol) methyl ether(meth)acrylate and 1-vinylimidazole; and water; wherein the chemical mechanical polishing composition has an acidic pH; (b) providing a chemical mechanical polishing pad; (c) providing a semiconductor wafer containing the nonferrous metal; (d) creating dynamic contact between the chemical mechanical polishing pad and the semiconductor wafer and (e) dispensing the polishing solution at or near the interface between the chemical mechanical polishing pad and the semiconductor wafer.

In another aspect of the present invention, there is provided a method for chemical mechanical polishing of a semiconductor wafer containing a nonferrous metal, comprising: (a) providing a chemical mechanical polishing composition comprising an oxidizer; an inhibitor for the nonferrous metal; 0.001 to 15 wt % of a water soluble cellulose; 0.05 to 20 wt % of a water soluble acid compound of a formula I as follows:

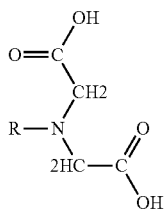

wherein R is a hydrogen or a carbon-containing compound; 0.005 to 5 wt % of a copolymer of poly(ethylene glycol) methyl ether(meth)acrylate and 1-vinylimidazole; 0.01 to 15 wt % of a complexing agent for the nonferrous metal; 0.01 to 15 wt % of a phosphorus compound; 1 to 25 wt % of an oxidizer; and water; wherein the chemical mechanical polishing composition has an acidic pH; (b) providing a chemical mechanical polishing pad; (c) providing a semiconductor wafer containing a nonferrous metal; (d) creating dynamic contact between the chemical mechanical polishing pad and the semiconductor wafer and (e) dispensing the polishing solution at or near the interface between the chemical mechanical polishing pad and the semiconductor wafer.

DETAILED DESCRIPTION

The chemical mechanical polishing composition and method of the present invention provide good metal removal rates, with metal clearing, and low dishing of the metal interconnects when a semiconductor wafer is exposed to chemical mechanical polishing and a chemical mechanical polishing composition containing: an inhibitor; a water soluble modified cellulose; a water soluble acid compound according to formula I:

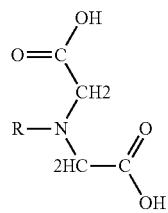

wherein R is a hydrogen or a carbon-containing compound; a copolymer of poly(ethylene glycol) methyl ether(meth)acrylate and 1-vinylimidazole; optionally, a complexing agent for the copper interconnect metal; optionally, a phosphorus compound; optionally, an oxidizer; and the balance water. The addition of the water soluble acid compound reduces the green staining that is associated with Cu-BTA ($Cu^{+1}$) precipitate.

For purposes of this specification Cu-BTA precipitate includes non-liquids such as solids, gels and polymers and may include $Cu^{+2}$ ions, spinel precipitates, spinel-like precipitates and impurities. From polishing experience, an insoluble Cu-BTA precipitate forms when the product of copper ion$^{(+1)}$ and BTA concentrations exceed the $K_{sp}$ under the polishing conditions. The precipitation of the Cu-BTA appears to occur in acidic polishing solutions following equilibrium expression (1):

$$BTAH + Cu^+ \xleftarrow{(slow)}_{(fast)} Cu\text{-}BTA + H^+ \qquad (1)$$

The chemical mechanical polishing composition of the present invention contains an inhibitor to control removal of nonferrous metal, such as, copper interconnect removal rate by static etch or other removal mechanism. Adjusting the concentration of the inhibitor adjusts the interconnect metal removal rate by protecting the metal from static etch. Preferably, the chemical mechanical polishing composition contains 0.01 to 15 wt % inhibitor. Most preferably, the chemical mechanical polishing composition contains 0.2 to 1.0 wt % inhibitor. In some embodiments, the inhibitor comprises a mixture of inhibitors. In some embodiments, the inhibitor is selected from azole inhibitors, which are particularly effective for polishing wafers having copper and silver interconnects. In some aspects of these embodiments, the inhibitor is selected from benzotriazole (BTA), mercaptobenzothiazole (MBT), tolytriazole (TTA), imidazole and combinations thereof. Combinations of azole inhibitors can increase or decrease the copper removal rate. In some aspects of these embodiments, the inhibitor is BTA, which is a particularly effective inhibitor for copper and silver.

The chemical mechanical polishing composition of the present invention contains a copolymer of poly(ethylene glycol) methyl ether(meth)acrylate and 1-vinylimidazole. In some embodiments, the chemical mechanical polishing composition contains 0.005 to 5 wt %, preferably 0.05 to 1 wt %, more preferably 0.05 to 0.5 wt %, still more preferably 0.09 to 0.25 wt % of a 9:1 to 1:9, preferably a 5:1 to 1:5, more preferably a 3:1 to 1:3; yet more preferably a 2:1 to 1:2, still more preferably a 1.5:1 to 1:1.5, yet still more preferably a 1.2:1 to 1:1.2, most preferably a 1:1 (on a weight basis) copolymer of poly(ethylene glycol) methyl ether(meth)acrylate and 1-vinylimidazole. In some embodiments, the chemical mechanical polishing composition contains 0.005 to 5 wt %, preferably 0.05 to 1 wt %, more preferably 0.05 to 0.5 wt %, still more preferably 0.09 to 0.25 wt % of a 9:1 to 1:9, preferably a 5:1 to 1:5, more preferably a 3:1 to 1:3; yet more preferably a 2:1 to 1:2, still more preferably a 1.5:1 to 1:1.5, yet still more preferably a 1.2:1 to 1:1.2, most preferably a 1:1 (on a weight basis) copolymer of poly(ethylene glycol) methyl ether methacrylate and 1-vinylimidazole. In some embodiments, the chemical mechanical polishing composition contains 0.005 to 5 wt %, preferably 0.05 to 1 wt %, more preferably 0.05 to 0.5 wt %, still more preferably 0.09 to 0.25 wt % of a 9:1 to 1:9, preferably a 5:1 to 1:5, more preferably a 3:1 to 1:3; yet more preferably a 2:1 to 1:2, still more preferably a 1.5:1 to 1:1.5, yet still more preferably a 1.2:1 to 1:1.2, most preferably a 1:1 (on a weight basis) copolymer of poly(ethylene glycol) methyl ether acrylate and 1-vinylimidazole. In some embodiments, the chemical mechanical polishing composition contains 0.005 to 5 wt %, preferably 0.05 to 1 wt %, more preferably 0.05 to 0.5 wt %, still more preferably 0.09 to 0.25 wt % of a 9:1 to 1:9, preferably a 5:1 to 1:5, more preferably a 3:1 to 1:3; yet more preferably a 2:1 to 1:2, still more preferably a 1.5:1 to 1:1.5, yet still more preferably a 1.2:1 to 1:1.2, most preferably a 1:1 (on a weight basis) copolymer of poly(ethylene glycol) methyl ether (meth)acrylate and 1-vinylimidazole having a weight average molecular weight, $M_w$, of 5,000 to 1,000,000; preferably 5,000 to 500,000; more preferably 10,000 to 250,000; still more preferably 10,000 to 100,000; yet more preferably 10,000 to 50,000; yet still more preferably 20,000 to 40,000. In some embodiments, the chemical mechanical polishing composition contains 0.005 to 5 wt %, preferably 0.05 to 1 wt %, more preferably 0.05 to 0.5 wt %, still more preferably 0.09 to 0.25 wt % of a 9:1 to 1:9, preferably a 5:1 to 1:5, more preferably a 3:1 to 1:3; yet more preferably a 2:1 to 1:2, still more preferably a 1.5:1 to 1:1.5, yet still more preferably a 1.2:1 to 1:1.2, most preferably a 1:1 (on a weight basis) copolymer of poly(ethylene glycol) methyl ether methacrylate and 1-vinylimidazole having a weight average molecular weight, $M_w$, of 5,000 to 1,000,000; preferably 5,000 to 500,000; more preferably 10,000 to 250,000; still more preferably 10,000 to 100,000; yet more preferably 10,000 to 50,000; yet still more preferably 20,000 to 40,000.

The chemical mechanical polishing composition of the present invention optionally contains a water soluble cellulose. In some embodiments, the chemical mechanical polishing composition contains 0 to 15 wt %; preferably 0.001 to 15 wt %, more preferably 0.005 to 5 wt %, still more preferably 0.01 to 3 wt % water soluble cellulose. In some embodiments of the present invention, the water soluble cellulose is a water soluble modified cellulose modified with a carboxylic acid functionality. Exemplary modified cellulose includes anionic gums such as at least one of agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their derivatives and copolymers. In some aspects of these embodiments, the water soluble modified cellulose is carboxy methyl cellulose (CMC). In some aspects of these embodiments, the CMC has a degree of substitution of 0.1 to 3.0 with a weight average molecular weight, $M_w$, of 1,000 to 1,000,000. In some aspects of these embodiments, the CMC has a degree of substitution of 0.7 to 1.2 with a weight average molecular weight of 40,000 to 250,000. For the purposes of this specification, the degree of substitution in CMC is the number of hydroxyl groups on each anhydroglucose unit in the cellulose molecule that is substituted. The degree of substitution can be considered as a measure of the "density" of carboxylic acid groups in the CMC.

The chemical mechanical polishing composition of the present invention optionally contains a water soluble acid compound according to formula I

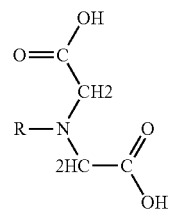

where R is hydrogen or a carbon-containing compound. These acid compounds are capable of complexing copper ions having a single valency$^{(+1)}$ and divalent$^{(+2)}$ copper ions. During polishing, the water soluble acid compound appears to complex with a sufficient number of copper ions to reduce the formation of Cu-BTA precipitate and control the rate of formation of $Cu^{+2}$ ions in expression (2) as follows:

$$2Cu^+ \rightarrow Cu^0 + Cu^{+2} \qquad (2)$$

In some embodiments of the present invention, the chemical mechanical polishing composition contains 0 to 20 wt %; preferably 0.05 to 20 wt %, more preferably 0.1 to 10 wt % water soluble acid compound according to formula I. In some aspects of these embodiments, the chemical mechanical polishing composition contains ≥0.4 wt %, preferably ≥0.4 to 5 wt % water soluble acid compound according to formula I. In some aspects of these embodiments, the water soluble acid compound according to formula I is selected from iminodiacetic acid (IDA); ethylenediaminetetraacetic acid (EDTA); and, combinations thereof. In some aspects of these embodiments, the water soluble acid compound according to formula I is EDTA. In some aspects of these embodiments, the water soluble acid compound according to formula I is IDA.

The chemical mechanical polishing composition of the present invention optionally contains a complexing agent for the nonferrous metal. The complexing agent can facilitate the removal rate of the metal film, such as copper. In some embodiments, the chemical mechanical polishing composition contains 0 to 15 wt %, preferably 0.01 to 15 wt %, more preferably 0.1 to 1 wt % complexing agent. Examplary complexing agents include, for example, acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. In some aspects of these embodiments, the complexing agent is selected from acetic acid, citric acid, ethyl acetoacetate, glycolic acid, lactic acid, malic acid, oxalic acid and combinations thereof. In some aspects of these embodiments, the complexing agent is malic acid.

The chemical mechanical polishing composition of the present invention optionally includes a phosphorus-containing compound. In some embodiments, the chemical mechanical polishing composition comprises 0 to 15 wt %, preferably 0.01 to 15 wt %; more preferably 0.05 to 10 wt %, still more preferably 0.1 to 5 wt %, yet more preferably 0.3 to 2 wt % phosphorous-containing compound. For purposes of this specification, a "phosphorus-containing" compound is any compound containing a phosphorus atom. In some embodiments, the phosphorus-containing compound is selected from a phosphate, pyrophosphate, polyphosphate, phosphonate, including, their acids, salts, mixed acid salts, esters, partial esters, mixed esters, and mixtures thereof. In some aspects of these embodiments, the phosphorus-containing compound is selected from zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, their acids, salts, mixed acid salts, esters, partial esters, mixed esters, and mixtures thereof. In some aspects of these embodiments, the phosphorus-containing compound is selected from phosphine oxides, phosphine sulphides and phosphorinanes and of phosphonates, phosphites and phosphinates, their acids, salts, mixed acid salts, esters, partial esters and mixed esters. In some embodiments, the phosphorus-containing compound is ammonium phosphate. In some embodiments, the phosphorus-containing compound is ammonium dihydrogen phosphate.

The chemical mechanical polishing composition of the present invention optionally contains an oxidizer. In some embodiments, the chemical mechanical polishing composition contains 0 to 25 wt %, preferably 1 to 25 wt %, more preferably 5 to 10 wt % oxidizer. In some embodiments, the oxidizer is selected from hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. In some embodiments, the oxidizer is hydrogen peroxide. When the chemical mechanical polishing composition contains an unstable oxidizing agent such as, hydrogen peroxide, it is preferable to incorporate the oxidizer into the chemical mechanical polishing composition at the point of use.

The chemical mechanical polishing composition of the present invention preferably relies upon a balance of deionized or distilled water to limit incidental impurities.

The chemical mechanical polishing composition of the present invention provides efficacy over a broad pH range. The useful pH range of the chemical mechanical polishing composition of the present invention extends from at 2 to 5. In some embodiments of the present invention, the chemical mechanical polishing composition exhibits a pH of 2 to 5, preferably 2 to 4, more preferably 2.5 to 4 at the point of use. Acids suitable for use adjusting the pH of the chemical mechanical polishing composition of the present invention include, for example, nitric acid, sulfuric acid, hydrochloric acid, and phosphoric acid. Bases suitable for use adjusting the pH of the chemical mechanical polishing composition of the present invention include, for example, ammonium hydroxide and potassium hydroxide.

The chemical mechanical polishing composition of the present invention optionally contain an abrasive. In some embodiments of the present invention, the chemical mechanical polishing composition contains 0 to 3 wt % abrasive. In some aspects of these embodiments, the chemical mechanical polishing composition contains ≤1 wt % abrasive. In some aspects of the present invention, the chemical mechanical polishing composition is abrasive-free.

Abrasive suitable for use with the present invention include, for example, abrasive having an average particle size of ≤500 nanometers (nm), preferably ≤100 nm, more preferably ≤70 nm. For purposes of this specification, particle size refers to the average particle size of the abrasive. In some embodiments, the abrasive is selected from colloidal abrasive, which can include additives, such as dispersants, surfactants, buffers, and biocides to improve the stability of the colloidal abrasive (e.g., Klebosol® colloidal silica from AZ Electronic Materials). In some embodiments, the abrasive is selected from fumed, precipitated and agglomerated abrasive. In some embodiments, the abrasive is selected from inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasive also include polymeric particles, coated polymeric particles, and surfactant stabilized particles. The preferred abrasive, if utilized, is silica.

The chemical mechanical polishing composition and method of the present invention are particularly useful for chemical mechanical polishing of semiconductor wafers having copper interconnects. Notwithstanding, it is believed that the chemical mechanical polishing composition of the present invention are also suitable for polishing semiconductor wafers containing other conductive metal interconnects, such as aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The chemical mechanical polishing composition and method of the present invention are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The chemical mechanical polishing composition of the present invention can also be used for ECMP (Electrochemical Mechanical Polishing).

Some embodiments of the present invention will now be described in detail in the following Examples.

EXAMPLES

Example 1

Copolymer Synthesis

A 1:1 (weight ratio) copolymer of poly(ethylene glycol) methyl ether methacrylate and 1-vinylimidazole was prepared in a 5 liter closed batch reactor outfitted with a nitrogen purge, an agitator and a temperature control mechanism. The reactor was closed up and purged with nitrogen to provide a nitrogen atmosphere within the reactor. Deionized water (1,800 g) was then introduced to the reactor and the reactor contents were heated to 85° C. While maintaining the temperature of the reactor contents at 85° C., a monomer mixture containing deionized water (170.3 g); poly(ethylene glycol) methyl ether methacrylate (425.4 g) and 1-vinylimidazole (425.3 g) was added to the reactor gradually over 120 minutes. An initiator charge containing a mixture of deionized water (388.4 g); a substituted azonitrile compound (Vazo® available from Du Pont) (25.6 g) and ammonium hydroxide (63.9 g) was gradually added to the reactor over a period of 140 minutes coinciding with the monomer mixture feed. Following the initiator feed, the reactor contents were held at 85° C. for thirty minutes before adding a shot chase containing a mixture of deionized water (85.2 g); a substituted azonitrile compound (Vazo® available from Du Pont) (4.3 g); and ammonium hydroxide (21.3 g) to the reactor. The reactor contents were then held for 120 minutes at 85° C. before feeding an additional 425.1 g of deionized water to the reactor. The reactor contents were then allowed to cool to ~60° C. The product copolymer was then isolated from the reactor contents.

Example 2

Polishing Tests

Two chemical mechanical polishing compositions were used in Example 2. Both chemical mechanical polishing compositions contained 0.30 wt % BTA; 0.22 wt % malic acid; 0.32 wt % carboxymethylcellulose (CMC); 1.3 wt % iminodiacetic acid (IDA); 2 wt % ammonium dihydrogenphosphate and 9 wt % hydrogen peroxide. The first chemical mechanical polishing composition (Composition 1) further contained 0.10 wt % of a 1:1 (weight basis) copolymer of poly(ethylene glycol) methyl ether methacrylate and 1-vinylimidazole having a weight average molecular weight, $M_w$, of ~36,000 prepared according to Example 1. The second chemical mechanical polishing composition (Composition 2) further contained 0.20 wt % of a 1:1 (weight basis) copolymer of poly(ethylene glycol) methyl ether methacrylate and 1-vinylimidazole having a weight average molecular weight, $M_w$, of ~36,000 prepared according to Example 1. The hydrogen peroxide was the last component added to the chemical mechanical polishing compositions before use. The noted component concentrations for the chemical mechanical polishing compositions are the point of use concentrations. The pH of the chemical mechanical polishing compositions was adjusted to 4.1 with nitric acid prior to the hydrogen peroxide addition. The pH following addition of the hydrogen peroxide was about 3.9.

Table 1 provides copper removal rate data determined with Composition 1. The copper removal rate experiments were performed using an Applied Materials, Inc. Mirra 200 mm polishing machine equipped with an ISRM detector system using an IC1010™ polyurethane polishing pad (commercially available from Rohm and Haas Electronic Materials CMP Inc.) under the down force condition provided in Table 1, a polishing solution flow rate of 160 ml/min, a table speed of 100 rpm and a carrier speed of 94 rpm. The copper blanket wafers used were electroplated and of 15K Å thickness (commercially available from Silyb). The copper removal rates were determined using a Jordan Valley JVX-5200T metrology tool. The copper removal experiments were each performed in duplicate. The data presented in Table 1 is the average for the duplicate experiments.

TABLE 1

| Down Force (psi) | Copper Removal Rate (Å/min) |
| --- | --- |
| 1 | 3862 |
| 1.5 | 5302 |
| 2 | 5850 |
| 2.5 | 6710 |

Table 2 provides copper removal rate and dishing performance using both Composition 1 and Composition 2 on 300 mm pattern wafers having copper interconnects and an MIT-754 pattern (commercially available from ATDF). An Applied Materials, Inc. Reflexion 300 mm polishing machine equipped with an ISRM detector system using an CUP4410 polyurethane polishing pad on platen 1 and a IC1010™ polyurethane polishing pad on platen 2 (both polishing pads are commercially available from Rohm and Haas Electronic Materials CMP Inc.) under downforce conditions (unless otherwise specified) of 1.5 psi (10.3 kPa), a polishing solution flow rate of 250 cc/min, a platen speed of 77 RPM, and a carrier speed of 71 RPM. A Diagrid® AD3BG-150855 diamond pad conditioner (commercially available from Kinik Company) was used to condition both polishing pads. The copper removal rates were determined using a Jordan Valley JVX®-5200T metrology tool. The dishing performances reported in Table 2 were determined using a Veeco® Dimension Vx 310 atomic force profiler (AFP).

TABLE 2

| Composition | Copper Removal Rate (Å/min) | Center (Å) | Middle (Å) | Right Edge (Å) | Left Edge (Å) |
| --- | --- | --- | --- | --- | --- |
| 1 | 4,600 | 300 | 330 | 480 | 430 |
| 2 | 5,569 | 540 | 420 | 500 | 440 |

We claim:

1. A method for chemical mechanical polishing of a semiconductor wafer containing a nonferrous metal, comprising: (a) providing a chemical mechanical polishing composition comprising 1 to 25 wt % of an oxidizer; 0.01 to 15 wt % of an inhibitor for the nonferrous metal; 0.005 to 5 wt % of a copolymer of poly(ethylene glycol) methyl ether(meth)acrylate and 1-vinylimidazole; and water; wherein the chemical mechanical polishing composition has an acidic pH; (b) providing a chemical mechanical polishing pad; (c) providing a semiconductor wafer containing the nonferrous metal; (d) creating dynamic contact between the chemical mechanical polishing pad and the semiconductor wafer and (e) dispensing the polishing solution at or near the interface between the chemical mechanical polishing pad and the semiconductor wafer.

2. The method of claim 1, wherein the copolymer in the chemical mechanical polishing composition provided is a 9:1 to 1:9 (weight basis) copolymer of poly(ethylene glycol) methyl ether methacrylate and 1-vinylimidazole and has a weight average molecular weight of 5,000 to 1,000,000.

3. The method of claim 1, wherein the chemical mechanical polishing composition provided further comprises 0.001 to 15 wt % of a water soluble cellulose.

4. The method of claim 1, wherein the chemical mechanical polishing composition provided further comprises 0.01 to 15 wt % of a complexing agent.

5. The method of claim 1, wherein the chemical mechanical polishing composition provided further comprises 0.01 to 15 wt % of a phosphorus-containing compound.

6. The method of claim 1, wherein the chemical mechanical polishing composition provided is abrasive-free.

7. The method of claim 1, wherein the chemical mechanical polishing composition provided further comprises:
0.05 to 20 wt % of a water soluble acid compound of formula I as follows:

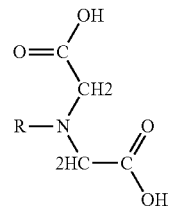

I wherein R is a hydrogen or a carbon-containing compound;
0.01 to 15 wt % of a complexing agent for the copper interconnect metal; and,
0.01 to 15 wt % of a phosphorus compound.

* * * * *